(12) United States Patent
Kundaliya et al.

(10) Patent No.: US 12,345,853 B2
(45) Date of Patent: Jul. 1, 2025

(54) ORGANIC ANTI-REFLECTIVE COATING FOR VISIBLE AND IR OPTICAL COMPONENTS FOR EMISSION EFFICIENCY

(71) Applicant: ams-OSRAM International GmbH, Regensburg (DE)

(72) Inventors: Darshan Kundaliya, Middleton, MA (US); Alan Lenef, Belmont, MA (US); Alan Piquette, Kensington, NH (US)

(73) Assignee: ams-OSRAM International GmbH, Regensburg (DE)

( * ) Notice: Subject to any disclaimer, the term of this patent is extended or adjusted under 35 U.S.C. 154(b) by 189 days.

(21) Appl. No.: 17/848,073

(22) Filed: Jun. 23, 2022

(65) Prior Publication Data

US 2023/0417953 A1    Dec. 28, 2023

(51) Int. Cl.
*G02B 1/118* (2015.01)
*G02B 1/111* (2015.01)
*B05D 1/00* (2006.01)
*B05D 1/18* (2006.01)

(52) U.S. Cl.
CPC ............. *G02B 1/118* (2013.01); *G02B 1/111* (2013.01); *B05D 1/00* (2013.01); *B05D 1/002* (2013.01); *B05D 1/005* (2013.01); *B05D 1/18* (2013.01)

(58) Field of Classification Search
CPC ........... G02B 1/111; G02B 1/118; B05D 1/00; B05D 1/002; B05D 1/005; B05D 1/02; B05D 1/18; H01L 33/00; H01L 33/44; H01L 33/50; H01L 33/56
USPC ......................................................... 427/162
See application file for complete search history.

(56) References Cited

U.S. PATENT DOCUMENTS

| | | | |
|---|---|---|---|
| 5,139,879 A | * | 8/1992 | Aharoni ............... C09D 133/16 525/200 |
| 6,680,080 B1 | * | 1/2004 | Belleville ............... G02B 1/111 427/168 |
| 2005/0006651 A1 | | 1/2005 | LeBoeuf et al. |
| 2010/0264432 A1 | * | 10/2010 | Liu ..................... H01L 25/0753 257/E33.056 |
| 2017/0104140 A1 | | 4/2017 | Gaska et al. |
| 2019/0056586 A1 | * | 2/2019 | Zhang ..................... B32B 3/263 |
| 2019/0326487 A1 | * | 10/2019 | Reeswinkel ............. C08J 7/065 |
| 2022/0416133 A1 | * | 12/2022 | Betthausen ............. H01L 33/52 |

FOREIGN PATENT DOCUMENTS

EP         3423883 B1 * 11/2023  ............. B32B 3/263

OTHER PUBLICATIONS

Uchida, Hirohisa et al., "Antireflection coating on organic nonlinear optical crystals using soft materials", Appl. Phys. Lett. 115, 231107, Dec. 5, 2019.

* cited by examiner

*Primary Examiner* — Brian K Talbot
(74) *Attorney, Agent, or Firm* — ArentFox Schiff LLP

(57) ABSTRACT

The present invention concerns an optoelectronic device, in particular an optical wavelength converter or infrared (IR) emitting or IR photodiode device, comprising an organic matrix, wherein the organic matrix is coated with at least one layer comprising an amorphous fluoropolymer. The invention also pertains to a method for the production of such devices.

6 Claims, 3 Drawing Sheets

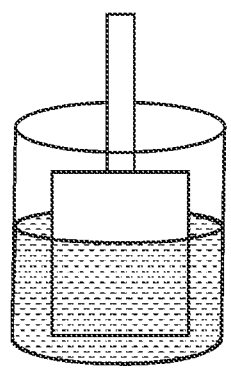
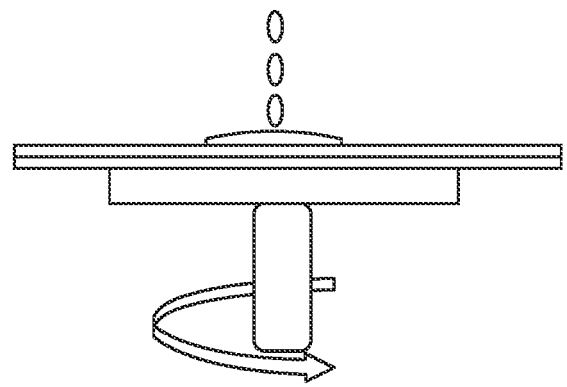
FIG. 1A  FIG. 1B
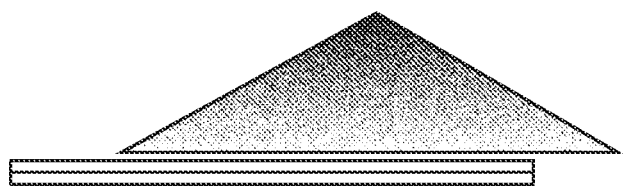
FIG. 1C
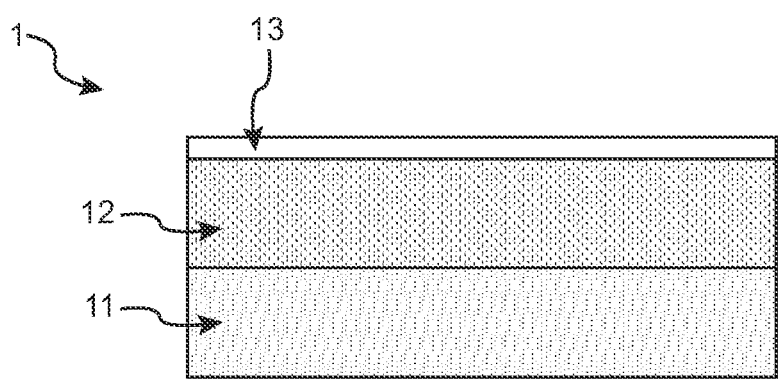
FIG. 1D

ORGANIC ANTI-REFLECTIVE COATING FOR VISIBLE AND IR OPTICAL COMPONENTS FOR EMISSION EFFICIENCY

The present invention concerns an optoelectronic device, in particular an optical wavelength converter or infrared (IR) emitting or IR photodiode device, comprising an organic matrix, wherein the organic matrix is coated with at least one layer comprising an amorphous fluoropolymer. The invention also pertains to a method for the production of such devices.

BACKGROUND

The optical performance of an anti-reflection coating is found be critical for wavelength converters. Some optical phenomena are unavoidable such as reflection loss of the emitted rays from the wavelength converters due to the refractive index differences of the wavelength converters and the air. For normal incidence, the surface reflection loss of the emitted rays from the wavelength converters can be written as:

$$R_L = \left(\frac{n_0 - n_1}{n_0 + n_1}\right)^2$$

where $n_0$ is the refractive index of the air and $n_1$ is the refractive index of the wavelength converters. By minimizing the index of refraction contrast between the wavelength converter and the air, the reflection loss (RL) could be minimized.

In conventional approaches, this loss could be reduced by applying an inorganic antireflection (AR) coating such as a single dielectric oxide layer (e.g., $SiO_2$) or multilayer oxide stacks (e.g. $TiO_2$, $Ta_2O_5$, $Nb_2O_5$, $SiO_2$, $Al_2O_3$ and $MgF_2$). While those materials may work for some wavelength converters, coating an organic material with inorganic dielectric oxides as those above will likely have issues of peeling and cracking due to differences in material properties related to linear expansion and viscoelasticity.

Hirohisa Uchida et. al., Appl. Phys. Lett. 115, 231107 (2019) discloses an anti-reflection coating on organic non-linear optical crystals using soft materials. In particular, a coating of DAST-crystals (4-N,N-dimethylamino-4'-N'-methyl-stilbazolium tosylate) with an amorphous fluoropolymer is described.

It is an object of the invention to overcome to above problems and provide wavelength converters or IR devices with reduced reflection loss and wherein the anti-reflective coating does not peel or crack from the surface.

SUMMARY OF THE INVENTION

This and other objects are addressed by the subject matter of the independent claims. Features and further aspects of the proposed principles are outlined in the dependent claims.

The inventors have realized that based on their knowledge there are no known products utilizing any direct organic anti-reflective coating on polymer-based wavelength converters or IR emitting or photodiode devices. Hence, they propose using an amorphous fluoropolymer to coat such converters, in particular organic matrix-based wavelength converters to avoid the above-mentioned problems. The use of such polymers can reduce the reflection loss in a wide range of wavelengths while maintaining the high transmittance in Visible, near-IR and mid-IR region. Hence, the proposed principle is suitable also for IR applications. The polymer matrices used in polymer-based wavelength converters or IR devices have different properties than conventionally used inorganic materials. One key difference for this invention is the thermal expansion. In general, the coefficient of linear expansion is low for inorganic materials and higher for organic materials. For example, the coefficient of thermal expansion (CTE) for fused silica is <1 ppm/K, while the CTEs of most polysiloxanes are typically >100 ppm/K. Such large mismatches in thermal expansion can lead to warpage, cracking, and/or delamination when such materials are used together in the same device. For polymer-based devices, the materials used as AR coatings should have CTEs that better match the polymer matrices. A further benefit lies in the low water absorption ratio effectively protecting the organic matrix-based converter from humidity.

In accordance with some aspects of the proposed principle, an optoelectronic device comprising an organic matrix is provided, wherein the organic matrix is coated with at least one layer comprising an amorphous fluoropolymer. The amorphous fluoropolymer layer comprises a refractive index between 1.3 to 1.4, preferably between 1.31 to 1.36, and more preferably between 1.34 to 1.35. The amorphous fluoropolymer layer is anti-reflective (AR).

The organic matrix in the optoelectronic device is preferably a silicone or polysiloxane. The organic matrix comprises converter particles or converter material, herein referred to as phosphor. In some instances, the optoelectronic device comprises a semiconductor body including an active layer adapted to emit light of a blue wavelength along an emission surface. The organic matrix is arranged on the emission surface. In some instances, the phosphor in the organic matrix is a blue absorbing phosphor, which converts the absorbed light to yellow or green or red or amber light, overall resulting in the emission of white light or the other colors.

In some further aspects of the proposed principle, the organic matrix may further comprise nanoparticles to adjust the refractive index of the organic matrix. The nanoparticles can comprise a higher or lower refractive index compared to the organic matrix including the phosphor. The nanoparticles act as a filler to adjust the refractive index of the matrix material. Depending on the refractive index chosen for the nanoparticles, one may adjust the refractive index of the organic matrix to the emission surface of semiconductor device, thus improving the efficiency in blue light emission. Alternatively, one can adjust the refractive index to the anti-reflective coating. As a further alternative, the refractive index of the nanoparticles can be adjusted such that use the resultant composite acts as an anti-reflective coating itself.

According to another aspect of the proposed principle, multiple layers of organic coatings of different refractive indices are applied. This can incrementally adjust the refractive index to air, thereby enhance light extraction from the surface of the organic matrix with the phosphor.

According to a further aspect of the proposed principle, a method for the preparation of an optoelectronic device as described herein is provided, the method comprising:
    a) providing a fluoropolymer solution;
    b) providing an organic phosphor-containing matrix;
    c) coating the organic phosphor-containing matrix with the fluoropolymer solution;
    d) drying the coated matrix at room temperature (about 25° C.);

e) baking the coated and dried matrix at a temperature as from 150° C. to 250° C.

In some further aspect the method also comprises providing an optoelectronic semiconductor body or a plurality thereof. In the latter case, the plurality of semiconductor body is processed on a growth substrate. In some instances, the organic phosphor-containing matrix is deposited on a surface of the plurality of semiconductor bodies, said surface defining a main light emission surface. The organic phosphor-containing matrix can be spin-coated, spray-coated, dip-coated or brush-coated or tape casted onto the surface. When spin coating methods are used, one can adjust spin time and speed to define the thickness of the coated matrix.

For deposition of the fluoropolymer solution, different coating methods are envisioned like dip-coating, spin-coating, spray-coating and brush-coating. Other techniques would include vacuum deposition, chemical vapor deposition, physical vapor deposition, etc. However, coating methods are probably most suitable.

According to a further aspect of the invention, the use of the device as described herein for converting blue light to yellow light or any other color light is provided.

According to a still further aspect of the invention, a method for converting blue light to yellow light or any other color light is provided.

SHORT DESCRIPTION OF THE DRAWINGS

Further aspects and embodiments in accordance with the proposed principle will become apparent in relation to the various embodiments and examples described in detail in connection with the accompanying drawings in which:

FIG. 1a to 1c show a preferred coating of an organic matrix by spin-coating or spray coating with a fluoropolymer solution;

FIG. 1d illustrate an optoelectronic device including an organic matrix-based converter and a coating as conducted by the method in accordance with the proposed principle;

DETAILED DESCRIPTION

Figure 2A:
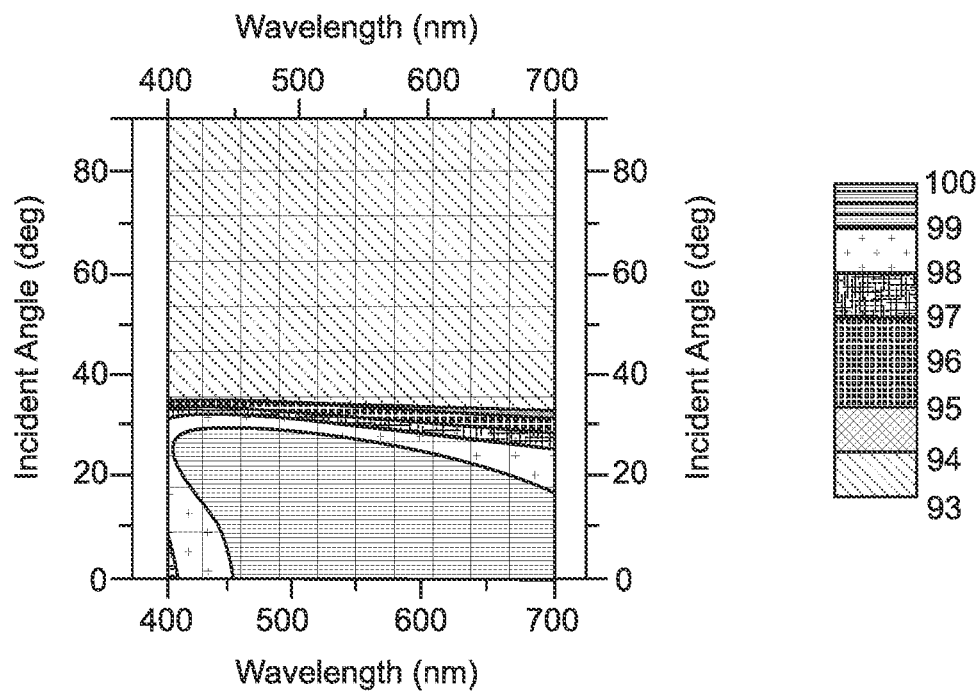
FIG. 2a shows a single layer coating using a nominal polymer refractive index $n_m=1.60$, transmission versus wavelength and incident angle in the matrix material with anti-reflective coating.

The invention provides an optoelectronic device comprising an organic matrix, wherein the organic matrix is coated with at least one layer comprising an amorphous fluoropolymer. The amorphous fluoropolymer layer comprises a refractive index of 1.3 to 1.4, preferably 1.31 to 1.36, and more preferably 1.34 to 1.35. The amorphous fluoropolymer layer comprises a coefficient of linear expansion of greater than 50 ppm/K, preferably greater than 70 ppm/K, and more preferably greater than 100 ppm/K.

FIG. 1a to 1c illustrate different method steps for coating the organic matrix-based converter material.

As an embodiment for the proposed method, a plurality of the semiconductor bodies are provided, which can be grown on a respective growth substrate and subsequently re-bonded to provide access to the light emission surface area. Depositing the organic matrix-based material including the converter particles directly onto the surface of the semiconductor bodies provides an easy and highly integrated way of producing optoelectronic devices suitable to emit converted light.

However, the organic matrix-based wavelength converter including the converter particles can also be processed separately and attached to the semiconductor body at a later stage.

Whether the wavelength converter is deposited directly on the chip or made separately and later attached to the chip, the antireflective coating is deposited on top of the organic matrix-based material with the converter particles embedded therein. In the case where the wavelength converter is made separately from the chip, the antireflective coating can be applied to the converter prior to attachment or after attachment to the chip, depending on the embodiment. For the purpose of applying the antireflective coating, different coating methods as already mentioned can be applied including spray coating as illustrated in FIG. 1c, spin coating as illustrated in FIG. 1b, but also dip coating shown in FIG. 1a.

For the latter method, the wafer structure is transferred for dipping the optoelectronic devices into a respective coating material. However, this particular step is rarely used as the coating material may also coat portions of the semiconductor bodies desired to be left free of any residual material. Consequently, this type of coating is more often performed when the organic matrix-based material is directly deposited on glass or any other temporary carrier, which is subsequently removed during a transfer of the organic matrix-based material with the converter particles on the light emission surface of optoelectronic devices.

The desired thickness of the antireflective coating lies in the range of 100 nm to 5 μm and can be in some instances sufficiently smaller than the corresponding thickness of the organic matrix-based material as such. However, the thickness of the antireflective coating does not only provide the optical improvement as mentioned already but may also support protection of the underlying organic matrix-based material with the converter particles against oxygen diffusion, water vapor diffusion or other components damaging the converter matrix.

Depending on the deposition method, the fluoropolymer solution can be sprayed or deposited with varying concentrations in the solvent onto the top surface of the organic matrix-based layer. For example, for spin coating an adjustable concentration of fluoropolymer between 1% and 9% in a solvent can be used. The fluoropolymer solution is solved in the solvent which is subsequently spin-coated or spray-coated onto the organic matrix-based material. The solvent quickly vaporizes leaving the fluoropolymer solution in a higher concentration on the surface. The rotation speed of spin coating can vary from around 100 rpm to approximately 10,000 rpm, but usually lies roughly between 500 rpm and 3000 rpm. The rotation speed together with the viscosity of the fluoropolymer solution will basically define the thickness of the overall antireflective coating.

For a spray coating process illustrated in FIG. 1c a similar approach can be used. However, if at all a smaller rotation is used because spraying should already distribute the fluoropolymer solution equally with a constant concentration across the surface of the organic matrix-based material. After the deposition process, the fluoropolymer material is dried up at room temperature for several hours before baking to remove the remaining residuals of the solvent. The baking temperature may range between 100° C. to 250° C. and often between 150° C. to 250° C. The selected temperature is lower than the temperature at which the organic matrix-based converter material starts to degrade.

In a final step, the optoelectronic devices can be separated by mechanical means including but not limited to, sawing or cutting.

The fluoropolymers having a refractive index in the preferred range 1.3 to 1.4 are for example Teflon™ AF, Cytop™, Poly(hexafluoropropylene oxide), fluorinated ethylene propylene, Poly(tetrafluoroethylene-co-hexafluoropropylene), Poly(pentadecafluorooctyl acrylate), Perfluoroalkoxy, Poly(tetra-fluoro-3-(heptafluoropropoxy)propyl acrylate), Poly(tetrafluoro-3-(pentafluoropropoxy)propyl acrylate), Poly(tetra-fluorethylene), Tetrafluoroethylene hexafluoropropylene vinylidene fluoride, Poly(undecafluorohexyl acrylate), Poly(nonafluoropentyl acrylate), Poly(tetrafluoro-3-(trifluoromethoxy)propyl acrylate), Poly(pentafluorovinyl propionate), Poly(heptafluorobutyl acrylate), Poly(trifluorovinyl acetate), Poly(1,1,1,3,3,3-hexafluoroisopropyl acrylate), Poly(octafluoropentyl acrylate), Poly(methy 3,3,3-trifluoropropyl siloxane), Poly(2.2.3.3.3-pentafluoropropyl acrylate), poly(2-heptafluorobutoxy)ethyl acrylate), Poly(chlorotrifluor-ethylene), Poly(1,1,1,3,3,3-hexafluorisopropyl methacrylate), Poly-(2,2,3,4,4-hexafluorobutyl acrylate), poly(2,2,3,4,4,4-hexafluoro-butyl acrylate), and Poly(2,2,3,3,3-pentafluoropropyl methacrylate).

The refractive indices are shown in the following table 1:

TABLE 1

Suitable fluoropolymers and their refractive indices

| Fluoropolymers | Refractive Index |
| --- | --- |
| Teflon ™ AF | 1.31+ |
| Cytop ™ | 1.31+ |
| Poly (hexafluoropropylene oxide) | 1.31+ |
| fluorinated ethylene propylene | 1.338 |
| Poly (tetrafluoroethylene-co-hexafluoropropylene) | 1.338 |
| Poly (pentadecafluorooctyl acrylate) | 1.339 |
| Perfluoroalkoxy | 1.340 |
| Poly (pentadecafluorooctyl acrylate) | 1.348 |
| Poly (tetrafluorethylene) | 1.350 |
| Tetrafluoroethylene hexafluoropropylene vinylidene fluoride | 1.350 |
| Poly (undecafluorohexyl acrylate) | 1.356 |
| Poly (nonafluoropentyl acrylate) | 1.360 |
| Poly/tetrafluoro-3-(trifluoromethoxy) propyl acrylate) | 1.360 |
| Poly (pentafluorovinyl propionate) | 1.364 |
| Poly (heptafluorobutyl acrylate) | 1.371 |
| Poly (trifluorovinyl acetate) | 1.375 |
| Poly (1,1,1,3,3,3-hexafluoroisopropyl acrylate) | 1.375 |
| Poly (octafluoropentyl acrylate) | 1.380 |
| Poly (methyl 3,3,3-trifluoropropyl siloxane) | 1.383 |
| Poly (2,2,3,3,4,4,4-heptafluorobutyl methacrylate) | 1.383 |
| Poly (2,2,3,3,3-pentafluoropropyl acrylate) | 1.385 |
| poly (2-heptafluorobutoxy) ethyl acrylate) | 1.390 |
| Poly (chlorotrifluorethylene) | 1.390 |
| Poly (1,1,1,3,3,3-hexafluorisopropyl methacrylate) | 1.390 |
| Poly (2,2,3,4-hexafluorobutyl acrylate) | 1.392 |
| Poly (2,2,3,4,4,4-hexafluorobutyl acrylate) | 1.394 |
| Poly (2,2,3,3,3-pentafluoropropyl methacrylate) | 1.395 |

The amorphous fluoropolymer layer is anti-reflective (AR). The thickness of the coated amorphous fluoropolymer layer is as from 100 nm to 5 μm, preferably 150 nm to 4 μm, more preferably 500 nm to 3 μm. the antireflective coating can have a single layer of one of the fluoropolymers but can also include more than a single layer. These layers are subsequently deposited by one of the above method steps (FIGS. 1 a, b and c).

The organic matrix-based material deposited or placed as a finished component on the semiconductor body of the optoelectronic device is preferably a silicone or polysiloxane. The organic matrix-based material comprises a phosphor. Preferably, the phosphor is adjusted to absorb blue light. The wavelength of the absorbed light is converted by the phosphor to yellow or green or red or amber light can result in the emission of white light or another color light depending on the phosphor or phosphor mixture. The phosphor is in the form of converter particles embedded in the matrix-based material. Any suitable phosphor material or combination of phosphor materials are considered to be embedded in the silicone or polysiloxane matrix. Exemplary phosphor materials that are suitable for use include but are not limited to phosphors such as oxide garnet phosphors and oxynitride phosphors. In some embodiments, the embedded phosphor particles is formed of one or more chemical composition selected from: garnets such as $Y_3Al_5O_{12}:Ce^{3+}$, $Lu_3Al_5O_{12}:Ce^{3+}$, $Tb_3Al_5O_{12}:Ce^{3+}$; nitrides such as $M_2Si_5N_8:Eu^{2+}$, wherein M=Ca,Sr,Ba; oxynitrides such as $MSi_2O_2N_2:Eu^{2+}$, wherein M=Ca, Sr, Ba; silicates such as $BaMgSi_4O_{10}:Eu^{2+}$, $M_2SiO_4:Eu^{2+}$, wherein M=Ca, Ba, Sr; combinations thereof, and the like. Alternatively or additionally, the one or more phoshor materials may include $MAlSiN_3:Eu$, wherein M is a metal selected from Ca, Sr, Ba; $A_2O_3:RE^{3+}$ wherein A is selected from Sc, Y, La, Gd, Lu and $RE^{3+}$ is a trivalent rare earth ions such as $Eu^{3+}$; and other tertiary and higher metal oxides doped with divalent or trivalent rare earth ions such as $Eu^{3+}$, $Ce^{3+}$, $Eu^{2+}$, $Tb^{3+}$, etc., including functional groups like molybdates, niobates or tungstates. Of course, other phopsohor materials that may be known to those of skill in the art may also be embedded in the organic matrix.

FIG. 1d illustrates an embodiment of an optoelectronic device in accordance with the proposed principle. The optoelectronic device 1 comprises a light-emitting, semiconductor body 11 that can be configured to emit light in the visible and/or the infrared regions.

In accordance with the proposed principle, an organic matrix-based material 12 with converter particles is arranged on the light emission surface of the semiconductor body. The matrix material 12 is preferably a polysiloxane. In cured form, the preferred polysiloxane material can be described by the formula $[RSiO_{3/2}]_x[R_2SiO]_y[R_3SiO_{1/2}]_z$ where x, y, and z indicate the relative proportion of the types of siloxane units present and R is a generic organic group that could be any combination of methyl and/or phenyl groups. The matrix material 12 could also be another type of polysiloxane or silicone material. Any light emitted through the emission surface is at least partially converted by the converter particles in the matrix-based material 12. Depending on the conversion ratio, one can refer to the conversion as partial conversion resulting in a mixing light (e.g. white light is a mix between blue and converted yellow light) or as full conversion, with all emitted light being converted. In accordance with the proposed principle an antireflective coating layer 13 of a fluoropolymer, for example, from the above-mentioned table 1 is deposited onto the organic matrix comprises converter material 16.

In an alternative embodiment, the organic matrix-based material 12 may comprise high or low refractive index nanoparticles. The nanoparticles act as a filler to adjust the refractive index of the matrix material wherein the resultant composite acts as an anti-reflective coating.

This is useful to adjust the refractive index to the emission surface of the semiconductor body or to the antireflective coating 13. In some instance, the matrix 12 with such nanoparticles can form an antireflective coating itself.

According to a further embodiment of the invention, multiple layers of organic coatings of different refractive indices are applied in order to enhance light extraction from the surface. That is, the device may have more than one coated layer of fluoropolymer on the organic matrix with varying refractive indices of the respective coated fluoropolymer layers.

The device according to the proposed principle provides some advantages over the prior art. The antireflective coating has a suitable index of refraction between 1 and 1.5 for organic wavelength converters and more preferably between 1.3 and 1.4. Reflection losses are decreased in a wide range of wavelengths by coating fluoropolymers. The antireflective coating exhibits high transmittance in the visible, the near-IR and the mid-IR region. The antireflective coating according to the invention has a large linear expansion coefficient compared to inorganic materials. It is a soft material.

A further advantage is that the material could be coated using cost-effective coating processes (practical approaches) compared to vacuum deposited processes. The antireflective coating has an advantageous water absorption ratio of less than 0.01%.

Anti-reflective (AR) coatings for optical components are also of importance in the infrared region, since most infrared transmitting materials yield a large reflection loss because of their high refractive indices. The fluoropolymer materials as described herein can be used on many IR emitting devices (up to 7 µm emission wavelength) as an anti-reflective coating. This refers to devices, which indirectly generate the IR emission, e.g. by light conversion, but also to devices that directly emit IR light. In addition, the fluoropolymer coating according to the proposed principle is effective for the protection of optical components that do not have enough durability for humidity.

The device as described herein can be used for converting blue light to yellow light. The result of this conversion is the emission of white light. Thus, also provided herein is a method for converting blue light to yellow light for the emission of white light.

The proposed principle also provides a method for the preparation of an optoelectronic device as described herein, the method comprising:
a) providing a fluoropolymer solution;
b) providing an organic phosphor containing matrix;
c) coating the organic phosphor containing matrix with the fluoropolymer solution;
d) drying the coated matrix at room temperature (about 25° C.);
e) baking the coated and dried matrix at a temperature as from 150° C. to 250° C.

The dried matrix can then be attached to a light emitting surface of an optoelectronic device. As solvents for the fluoropolymer solution, organic polar aprotic solvents and high polar solvents such as perfluorinated solvents or DMSO may be used.

The coating may be performed according to any coating method known in the art such as spin-coating, spray coating, dip coating and the like.

The skilled artisan is aware of these methods. Spin-coating and spray coating is preferred.

After the coating, a drying step is performed at room temperature (about 25° C.) for a period of up to 24 hours. The drying is performed for each coated layer in case a multilayer device is envisaged. Multilayers of organic coatings of different refractive indices may be applied in order to enhance light extraction from the surface.

After drying, the coated matrix is baked at a temperature as from 150 to 250° C. for 30 minutes to 60 minutes for fixation of the fluoropolymer layer or layers, respectively, on the organic matrix.

EXPERIMENTAL SECTION

In a first example, the fluoropolymer is chosen such that its refractive index $n_F$ is optimized for a single quarter-wave anti-reflective coating. For example, at normal incidence, it is well known that the condition:

$$n_F = \sqrt{n_0 n_m} \quad (1)$$

leads to zero reflectance at normal incidence, where $n_0$ is the excitant medium refractive index (usually air), and $n_m$ is the refractive index of the organic matrix-based material (polysiloxane) that supports the phosphor particles.

TABLE 2

Ideal quarter-wave (normal incidence) fluoropolymer anti-reflective coating refractive indices based on organic matrix refractive indices.

| Matrix Type | $n_m$ | $N_F$ |
| --- | --- | --- |
| Low refractive index | 1.43 | 1.196 |
| High refractive index | 1.53 | 1.237 |
| Ultra-high refractive index | 1.60 | 1.265 |

Thus, while the low refractive index methyl-based-matrix does not have a matching single layer fluoropolymer anti-reflective material, the phenyl-based-matrix can probably have high anti-reflective efficacy with the lowest RI fluoropolymers in Table 1. As an example, a single layer anti-reflective based on Cytop™ with a refractive index $n_F$=1.31 is considered. Using a nominal polysiloxane refractive index $n_m$=1.60, a transmission versus wavelength and incident angle in the matrix material as shown in the FIG. 2a is obtained. FIG. 2a shows the use of a nominal polysiloxane with a refractive index $n_m$=1.60 and shows the transmission versus wavelength and incident angle in the matrix material with anti-reflective coating.

Figure 2B:
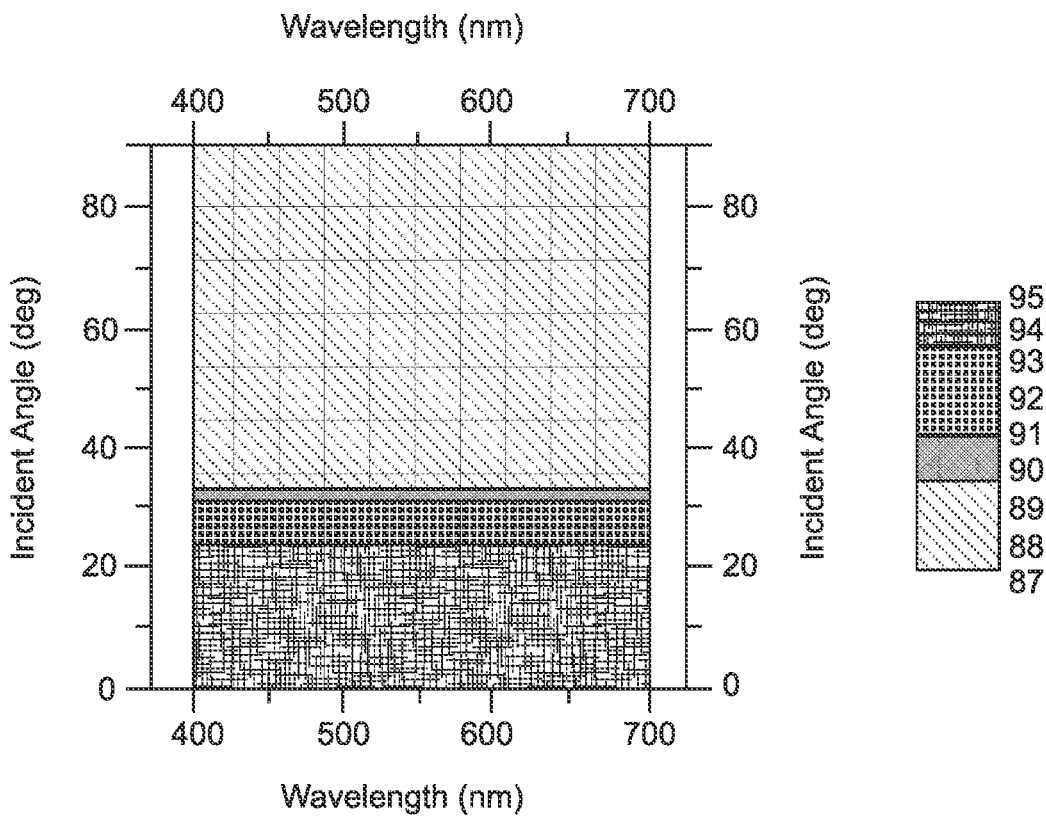
FIG. 2b shows a single layer coating using a nominal polymer refractive index $n_m=1.60$, transmission versus wavelength and incident angle in the matrix material without anti-reflective coating.
Figure 3:
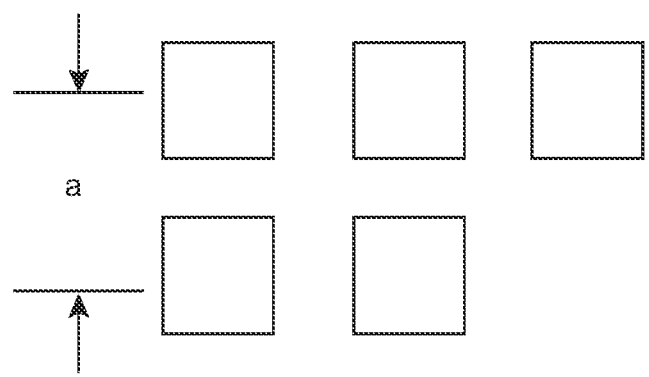
FIG. 3 shows a typical placement of fluoropolymer, e.g., Cytop pillars with period $\alpha<314$ nm structure when using a methyl-based polysiloxane with $n_m=1.43$ and the fluoropolymer as the patterned anti-reflective material and a filling fraction $v=0.61$, QW thickness at $\lambda_0=572$ nm and h=119 nm.

As can be seen, the critical angle is approximately 38°. The data show the result for a 109.2 nm thick film, showing very high transmission (>99%) over the full visible range expected from a blue excited LED. This is a quarter-wave thickness at free-space wavelength λ=572 nm. This compares to the transmission (<95%) for no coating as shown in the FIG. 2b, using a nominal polysiloxane refractive index $n_m$=1.60, and plotting transmission versus wavelength and incident angle in the matrix material without anti-reflective coating. One can easily recognize that the transmission is significantly smaller and does not reach close to 100%.

A presumably even better transmission could probably be achieved by combining more than one fluoropolymer layer to introduce a more graded index, perhaps combined with a higher intermediate material such as PMMA. This multilayer coating can be found through well-known multi-layer thin film optimization routines.

According to a second example, especially if a lower refractive index methyl-based polysiloxane is used, it may still be desirable to further reduce the refractive index of the anti-reflective coating. This can be done by using an effective medium. For example, the Cytop™ coating can be nano-structured to be a sub-wavelength grating. For a square lattice, this implies that the spacing between nano-elements d must satisfy:

$$d < \frac{\lambda_{bl}}{n_m}, \qquad (2)$$

where, $\lambda_{bl}$ is the blue LED wavelength. The effective index $n_{eff}$ of the nano-element array is then roughly determined by the area filling fraction v.

$$n_{eff} = \sqrt{v_F^2 + (1-v)n_0^2}$$

Thus, if a methyl-based polysiloxane with nm=1.43 is used, then Eq. (1) shows that the optimal effective anti-reflective coating index is $n_{eff}$=1.20. Using Cytop™ as the patterned anti-reflective material, Eq. (3) shows that a filling fraction v=0.61 is needed. The QW thickness at $\lambda_0$=572 nm would then be h=119 nm. A typical structure is shown in FIG. 4, showing the placement of Cytop™ pillars with a period a<314 nm.

Citations and Legal Duty of Disclosure a. CYTOP is a material provided by many manufacturers e.g., AGC Chemical lnc. (http://www.agc.com) (https://www.agcchem.com/products/cytop/)
b. MY Polymers Ltd., a manufacturer of low refractive index optical adhesives and coating materials, offers a line of polymers with refractive indices in the range 1.32-1.33. https://www.mypolymers.com/
c. Teflon™ AF amorphous fluoropolymers by Chemours (DuPont Spin-off} are distinct from other fluoropolymers in that they have the lowest index of refraction of any known polymer. In addition, they are:
 soluble in selected solvents
 Have high gas permeability
 High compressibility
 Creep resistance
 Low thermal conductivity
 Have the lowest dielectric constant of any known solid polymer
 Aimed optical applications include fibre optic core and cladding, optical lenses, anti-reflective coatings, molded- or solution-processed parts
 https://www.chemours.com/es/-/media/files/teflon/intro-to-fluoropolymers.pdf
d. "Antireflection coating on organic nonlinear optical crystals using soft materials", Applied Physics Letters 15, 231107 (2019).

The invention claimed is:

1. Method for the preparation of an optoelectronic device, comprising:
 a) providing a fluoropolymer solution;
 b) providing an organic matrix-based material comprising converter particles;
 c) coating the organic matrix-based material with the fluoropolymer solution;
 d) drying the organic matrix-based material coated with the fluoropolymer solution at room temperature (about 25° C.); and
 e) providing a plurality of optoelectronic bodies, each optoelectronic body having a light emission surface;
 f) depositing the organic matrix-based material with the converter particles coated with the fluoropolymer solution on the light emission surface by spray coating or spin coating or tape casting; and
 g) baking the coated plurality of optoelectronic bodies at a temperature from 150° C. to 250° C.

2. Method according to claim 1, wherein the fluoropolymer solution has a concentration of 1 to 9 wt.-% in an organic solvent.

3. Method according to claim 1, further comprising:
 providing one or more additional fluoropolymer solutions, wherein the one or more additional fluoropolymers having different refractive indices;
 repeating the coating and drying in steps c) to d) for each additional fluoropolymer solution; and
 performing step g) after coating and drying the one or more additional fluoropolymer solutions.

4. Method according to claim 1, wherein the coating is performed via spin-coating, spray coating or dip coating.

5. Method according to claim 1, wherein fluoropolymer is selected from the group consisting of amorphous fluoropolymer, Poly (hexafluoropropylene oxide), fluorinated ethylene propylene, Poly (tetrafluoroethylene-co-hexafluoropropylene), Poly (pentadecafluorooctyl acrylate), Perfluoroalkoxy, Poly (tetra-fluoro-3-(heptafluoropropoxy) propyl acrylate), Poly (tetrafluoro-3-(pentafluoropropoxy) propyl acrylate), Poly (tetrafluorethylene), Tetrafluoroethylene hexafluoropropylene vinylidene fluoride, Poly (undecafluorohexyl acrylate), Poly (nonafluoropentyl acrylate), Poly/tetrafluoro-3-(trifluoromethoxy) propyl acrylate), Poly (pentafluorovinyl propionate), Poly (heptafluorobutyl acrylate), Poly (trifluorovinyl acetate), Poly (1,1,1,3,3,3-hexafluoroisopropyl acrylate), Poly (octafluoropentyl acrylate), Poly (methy 3,3,3-trifluoropropyl siloxane), Poly (2,2,3,3,4,4,4-heptafluorobutyl methacrylate), Poly (2,2,3,3,3-pentafluoropropyl acrylate), poly (2-heptafluorobutoxy) ethyl acrylate), Poly (chlorotrifluorethylene), Poly (1,1,1,3,3,3-hexafluorisopropyl methacrylate), Poly (2,2,3,4,4-hexafluorobutyl acrylate), poly (2,2,3,4,4,4-hexafluorobutyl acrylate), and Poly (2,2,3,3,3-pentafluoropropyl methacrylate).

6. Method according to claim 3, wherein the step c) further comprises:
 pattern the fluoropolymer to form a sub-wavelength grating in form of plurality of pillars arranged in columns and rows.

* * * * *